US010793447B2

(12) United States Patent
Kang (10) Patent No.: US 10,793,447 B2
(45) Date of Patent: Oct. 6, 2020

(54) SYSTEM AND METHOD FOR PLASMA DISCHARGE IN LIQUID

(71) Applicant: Energy Onvector, LLC, Camden, NJ (US)

(72) Inventor: Jun Kang, Cherry Hill, NJ (US)

(73) Assignee: Energy Onvector, LLC, Camden, NJ (US)

( * ) Notice: Subject to any disclaimer, the term of this patent is extended or adjusted under 35 U.S.C. 154(b) by 600 days.

(21) Appl. No.: 15/511,425

(22) PCT Filed: Sep. 15, 2015

(86) PCT No.: PCT/US2015/050137
§ 371 (c)(1),
(2) Date: Mar. 15, 2017

(87) PCT Pub. No.: WO2016/044239
PCT Pub. Date: Mar. 24, 2016

(65) Prior Publication Data
US 2017/0291830 A1    Oct. 12, 2017

Related U.S. Application Data

(60) Provisional application No. 62/050,369, filed on Sep. 15, 2014.

(51) Int. Cl.
*C02F 1/30* (2006.01)
*H05H 1/48* (2006.01)
(Continued)

(52) U.S. Cl.
CPC ............ *C02F 1/30* (2013.01); *C02F 1/4608* (2013.01); *H01J 37/32* (2013.01);
(Continued)

(58) Field of Classification Search
CPC .... C02F 2001/46171; C02F 2201/4619; C02F 2301/046; C02F 2303/26; C02F 1/46; C02F 1/48; B01J 19/08
See application file for complete search history.

(56) References Cited

U.S. PATENT DOCUMENTS 3,097,292 A    7/1963   Tibor et al.
3,760,145 A *  9/1973   Wolf ................. H01J 37/32055
                                                    219/121.36
(Continued)

FOREIGN PATENT DOCUMENTS

WO    2014108659 A1    7/2014

OTHER PUBLICATIONS

Ahmadun et al., "Review of technologies for oil and gas produced water treatment," Journal of Hazardous Materials, vol. 170, pp. 530-551, 2009.
(Continued)

*Primary Examiner* — Walter D. Griffin
*Assistant Examiner* — Cameron J Allen
(74) *Attorney, Agent, or Firm* — Riverside Law LLP (57) ABSTRACT

A system for generating a plasma discharge in liquid utilizes first and second electrodes spaced apart in an interior space of a vessel holding the liquid. A channel can be defined in certain embodiments at least partially by at least one of the first and second electrodes, and an inlet in fluid communication with the interior space is configured to generate a vortical fluid flow in the vessel. A method for generating a plasma discharge in liquid is also provided.

14 Claims, 10 Drawing Sheets

(51) Int. Cl.
*H01J 37/32* (2006.01)
*C02F 1/46* (2006.01)
*H05H 1/34* (2006.01)
*C02F 103/10* (2006.01)

(52) U.S. Cl.
CPC .... *H01J 37/3244* (2013.01); *H01J 37/32568* (2013.01); *H05H 1/48* (2013.01); *C02F 2103/10* (2013.01); *H01J 37/32541* (2013.01); *H01J 37/32596* (2013.01); *H05H 2001/3468* (2013.01)

(56) References Cited

U.S. PATENT DOCUMENTS

| | | | |
|---|---|---|---|
| 2008/0099406 | A1 | 5/2008 | Ruan et al. |
| 2010/0219136 | A1 | 9/2010 | Campbell et al. |
| 2011/0031124 | A1 | 2/2011 | Hana |
| 2011/0062014 | A1* | 3/2011 | Gutsol ............... C01B 3/342 204/164 |
| 2011/0250098 | A1 | 10/2011 | Matveev |
| 2013/0299351 | A1 | 11/2013 | Livshitz et al. |
| 2014/0054242 | A1* | 2/2014 | Imai ................ C02F 1/4608 210/748.17 |
| 2014/0210344 | A1* | 7/2014 | Foret ............... H01J 37/32055 315/111.11 |
| 2015/0251933 | A1 | 9/2015 | Nakamura et al. |
| 2015/0307370 | A1 | 10/2015 | Kang |
| 2016/0074829 | A1 | 3/2016 | Kitano et al. |

OTHER PUBLICATIONS

McIntyre et al., "Uses of ultraviolet/ozone for hydrocarbon removal: Applications to surfaces of complex composition or geometry," Journal of Vacuum Science & Technology A: Vacuum, Surfaces, and Films, vol. 9, pp. 1355-1359, 1991.

Yang et al., "Removal of CaCO3 scales on a filter membrane using plasma discharge in water," Int J. Heat Mass Transfer, vol, 52, pp. 4901-4906, 2009.

Yang et al., "Mineral Fouling Control by Underwater Plasma Discharge in a Heat Exchanger," ASME Journal of Heat Transfer, vol. 133, p. 054502, 2011.

Kim et al., "Concentration of hydrogen peroxide generated by gliding arc discharge and inactivation of *E. coli* in water," International Communications in Heat and Mass Transfer, vol. 42, pp. 5-10, 2013.

Sano et al., "Properties of carbon onions produced by an arc discharge in water," Journal of Applied Physics, 92(5): p. 2783-2788, 2002.

Lange et al., "Nanocarbon production by arc discharge in water," Carbon, 41(8): p. 1617-1623, 2003.

Guo et al., "Structure of nanocarbons prepared by arc discharge in water," Materials Chemistry and physics, 105(2): p. 175-178, 2007.

Mezei, et al.,"Electrolyte cathode atmospheric glow discharges for direct solution analysis," Applied Spectroscopy Reviews, 42(6): p. 573-604, 2007.

Maksimov, A., V. Titov, and A. Khlyustova, "Electrolyte-as-cathode glow discharge emission and the processes of solution-to-plasma transport of neutral and charged species," High Energy Chemistry, 38(3): p. 196-199, 2004.

Wright, K.C., et al., "New Fouling Prevention Method using a Plasma Gliding Arc for Produced Water Treatment," Desalination, 345: p. 64-71, 2014.

Czemichowski, et al., "Spectral and electrical diagnostics of gliding arc," Acta Physica Polonica—Series A General Physics, vol. 89, pp. 595-604, 1996.

Mutaf-Yardimci, et al., "Thermal and nonthermal regimes of gliding arc discharge in air flow," Journal of Applied Physics, vol. 87, pp. 1632-1641, 2000.

Kim et al. "Use of plasma gliding arc discharge on the inactivation of *E. coli* in Water," Separation and Purification Technology, 120, pp. 423-428, 2013.

Kim et al. "Residual Effects and energy cost of Gliding Arc Discharge Treatment on the Inactivation of *E. coli* in water" International Journal of Heat and Mass Transfer: Sep. 2014, vol. 77: 1075-1083.

* cited by examiner

TOP VIEW
FIG. 3B

SIDE VIEW
FIG. 3A

SYSTEM AND METHOD FOR PLASMA DISCHARGE IN LIQUID

CROSS-REFERENCE TO RELATED APPLICATIONS

This application is a national stage filing of International Application No. PCT/US15/50137 filed on Sep. 15, 2015, which claims priority to U.S. provisional application No. 62/050,369 filed on Sep. 15, 2014, both of which are incorporated herein by reference in their entireties.

BACKGROUND OF THE INVENTION

Oil and gas production processes generate large volumes of liquid waste. For example, hydraulic fracturing of shale utilizes large volumes of high-pressure water to fracture shale formation. The wastewater generated during the drilling phase is called flowback water, whereas the water generated during the production phase is called produced water. Both the flowback and produced waters contain various organic and inorganic components, and discharging produced water can pollute surface and underground water and soil. Since approximately 250 million barrels per day (i.e., ~30 million $m^3$ per day) of produced water are generated globally (see F. I.-R. Ahmadun et al., "Review of technologies for oil and gas produced water treatment," *J. Hazard. Mater.*, vol. 170, pp. 530-551, 2009), an amount that is expected to continue increasing for an extended period of time, there is a growing need for new methods to treat large volumes of produced water robustly and efficiently. With volatility in the prices of oil and gas, there is a pressing parallel need to reduce the costs of production, including produced water treatment costs.

A variety of methods are currently utilized to treat produced water for the purposes of discharge as well as for recycling and reuse in subsequent hydraulic fracturing operations. This diverse set of water treatment techniques include de-oiling (removing dispersed oil and grease), removal of soluble organics, disinfection, suspended solid particle removal, dissolved gas removal (including hydrocarbon gases, carbon dioxide, and hydrogen sulfide), desalination (removing sodium and chloride ions), and water-softening (reducing calcium and magnesium hardness), among others (see F. I.-R. Ahmadun et al.).

Plasma arc discharge generates a significantly elevated temperature beyond 2,000 K around the arc (see A. Czernichowski et al., "Spectral and electrical diagnostics of gliding arc," *Acta Physica Polonica-Series A General Physics*, vol. 89, pp. 595-604, 1996; and O. Mutaf-Yardimci et al., "Thermal and nonthermal regimes of gliding arc discharge in air flow," *Journal of Applied Physics*, vol. 87, pp. 1632-1641, 2000). In addition, plasma discharge generates active plasma species directly in liquid, i.e., OH, O, $O_3$, $H_2O_2$, $NO_x$, UV and electric fields. Thus, if one can successfully generate plasma discharge in produced water, the plasma discharge can be applied for the removal of dispersed oil/grease and soluble hydrocarbons (see N. McIntyre et al., "Uses of ultraviolet/ozone for hydrocarbon removal: Applications to surfaces of complex composition or geometry," *J. Vac. Sci. Technol., A: Vacuum, Surfaces, and Films*, vol. 9, pp. 1355-1359, 1991), water softening (see Y. Yang et al., "Removal of $CaCO_3$ scales on a filter membrane using plasma discharge in water," *Int. J. Heat Mass Transfer*, vol. 52, pp. 4901-4906, 2009; and Y. Yang et al., "Mineral Fouling Control by Underwater Plasma Discharge in a Heat Exchanger," *J. Heat Transfer*, vol. 133, p. 054502, 2011), and disinfection (see H.-S. Kim et al., "Concentration of hydrogen peroxide generated by gliding arc discharge and inactivation of E. coli in water," *Int. Commun. Heat Mass Transfer*, vol. 42, pp. 5-10, 2013). These active plasma treatment species may be employed for produced and flowback water from oil and gas exploration as well as, more broadly, wastewater streams from municipalities and range of industrial processes.

Generation of plasma discharge requires the use of two or more electrodes, for example, at least one cathode and one anode, positioned relatively close together (e.g., 2-5 mm for discharge in gas). When the voltage between the two electrodes increases to a certain value such as 2 kV, breakdown of gas between the two electrodes takes place, generating a discharge of plasma. Depending on the magnitude of the voltage across the two electrodes and other factors such as the geometry of electrodes, a variety of different types of plasma discharges can be produced and controlled, including corona, spark, and arc.

When one attempts to produce plasma discharges in liquid such as water, it is more complicated. As soon as two electrodes with high voltage are immersed in water, electrolysis occurs, generating gas bubbles at both electrodes. When there are sufficient amounts of gas at the two electrodes, the "breakdown" of water can occur, and subsequently plasma discharge takes place in water. The use of gas bubbles generated from electrolysis can result in breakdown in a small volume of water, for example, as in a beaker. However, in order to treat several gallons of water per minute or more, plasma generation using gas bubbles generated from electrolysis is a method that is neither sufficient nor practical.

Another technical challenge in generating plasma discharge in water treatment applications such as produced water or seawater is their high electric conductivity. The conductivity of produced water is in the range of 100-200 mS/cm due to a large amount of dissolved ions such as sodium, calcium, chloride, magnesium, and others (see F. I.-R. Ahmadun et al.), whereas that of seawater is about 50 mS/cm (see V. L. Snoeyink et al., *Water chemistry*. New York: John Wiley, 1980). In liquids with such high conductivity, electrons instantly and continually flow from cathode to anode as high electric conductivity water provides an effective path for electrons to flow, a phenomenon that can be referred as electron leakage in liquid. Accordingly, compressed gas is injected at or between the two electrodes to provide a gap to assist breakdown such that plasma is able to be discharged in high conductivity liquid using only a moderately high voltage of ~1 kV. When gas injection is utilized to assist the generation of plasma discharges in high electric-conductivity liquids, it is essential to have gas bubbles remain in the gap between the two electrodes such that the breakdown of water takes place, leading to the generation of plasma discharge.

Figure 1A:
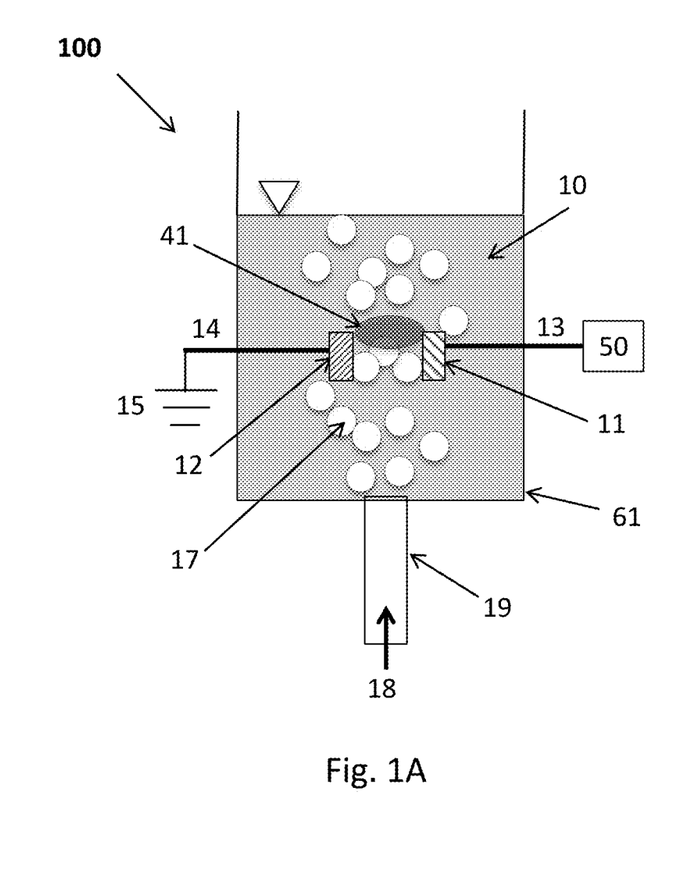
FIG. 1 is a schematic diagram of a prior art system for plasma arc discharge between two electrodes, where gas bubbles are introduced from the bottom.
Figure 1B:
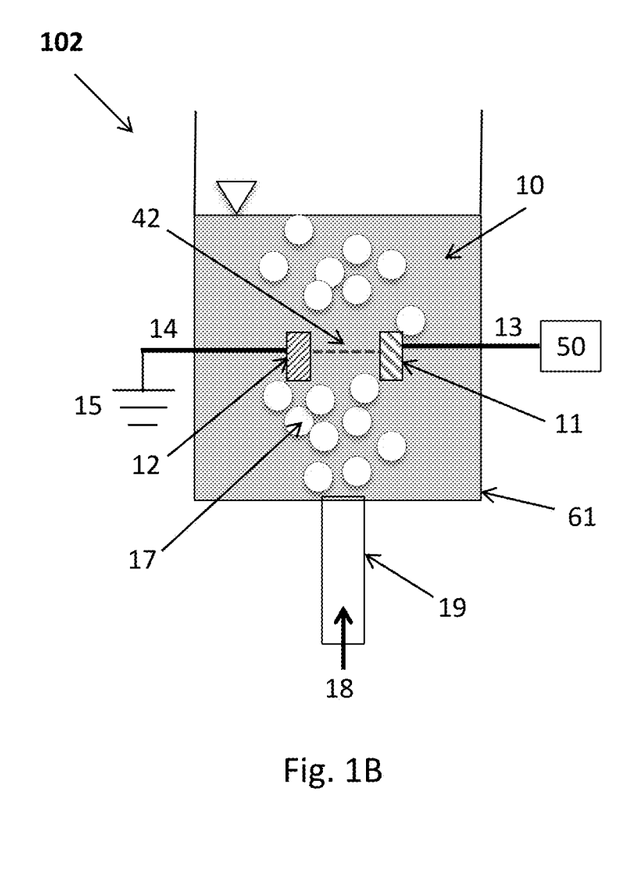

At the moment when gas bubbles occupy the space between the two electrodes by displacing liquid, breakdown occurs, generating plasma discharge. However, since gas density is approximately 1,000 times smaller than that of liquid (i.e., water) (see B. Munson et al., *Fundamentals of Fluid Mechanics,* 7th ed. New York: John Wiley & Sons, Inc, 2013), gas bubbles tend to rise in a liquid-filled plasma reactor due to the buoyancy force created by the density difference between gas and liquid. FIGS. 1A and 1B show an example of gas injection between two electrodes according to a prior art system 100, 102. Two electrodes 11 and 12 are used for the generation of plasma discharge 41 in plasma reactor 61: one is the ground electrode 12, and another is high-voltage (HV) electrode 11. Compressed gas 18 is injected from the bottom of the reactor 61 through a gas inlet 19, producing a number of gas bubbles 17 in liquid medium 10. When the gas bubbles 17 occupy the space 42 between the two electrodes, breakdown occurs, generating plasma discharge 41 in the liquid 10 (see 100, FIG. 1A). When gas bubbles 17 are not present in the space 42 between the two electrodes, breakdown does not occur (see 102, FIG. 1B), and accordingly, there is no plasma discharge. In the arrangement of the two electrodes as shown in FIGS. 1A and 1B, the generation of plasma discharge 41 solely depends on the gas dynamics of the bubbles 17. Since the motion of a number of small gas bubbles is not easily controllable, the generation of plasma discharge 41 in liquid 10 becomes unstable and unreliable. In addition, when plasma discharge is applied to treat a large volume of water, for example, at a flow rate of 10 or 100 gpm, it is technically challenging because plasma discharges often occur only between the two electrodes placed relatively close together (e.g., a 5 mm space) and not in the bulk volume of water.

Therefore, there is a need in the art to have a large size plasma discharge in a plasma reactor such that there is a relatively large volume of exposure and sufficient contact time between the plasma discharge and water being treated. Further, there is a need to contain, restrict or control the gas bubbles within a small space between the two electrodes. Methods to restrict the motion of the gas injected to plasma reactor are necessary so that gas bubbles stay longer in the plasma reactor, resulting in the steady and stable generation of plasma discharges in liquid. Still further, there is a need for a method of generating plasma discharge in liquid which does not depend on the electric conductivity of the liquid.

SUMMARY OF THE INVENTION

In one embodiment, a system for generating a plasma discharge in liquid includes a first and second electrode spaced apart in an interior space of a vessel, a channel defined at least partially by at least one of the first and second electrodes, and a first inlet in fluid communication with the interior space configured to generate a vortical fluid flow at a tip of the first electrode. In one embodiment, a second outlet in fluid communication with the interior space configured to facilitate the generation of the vortical fluid flow. In one embodiment, the first inlet and the second outlet are positioned to generate a forward vortex liquid flow. In one embodiment, the first inlet and the second outlet are positioned to generate a reverse vortex liquid flow. In one embodiment, the first inlet and the second outlet are positioned to generate a vortex between the first and second electrode. In one embodiment, the first electrode is a high-voltage electrode and the second electrode is a ground electrode. In one embodiment, the first electrode is a positive high-voltage electrode and the second electrode is a negative high-voltage electrode. In one embodiment, the second electrode is coaxially disposed around the first electrode. In one embodiment, the channel is disposed between the first and second electrode. In one embodiment, both the first and second electrodes have a hollow cylindrical geometry, and the second electrode is coaxially disposed around the first electrode. In one embodiment, an insulation structure is disposed between the first and second electrode along a length of the first electrode.

In one embodiment, a method for generating a plasma discharge in liquid is disclosed. The method includes the steps of positioning a first electrode and a second electrode the liquid, where the first electrode is separated from the second electrode by a distance, generating a voltage between the first and second electrode, injecting a gas through a channel defined at least partially by at least one of the first and second electrodes, and generating a vortex in the liquid at a tip of the first electrode. In one embodiment, an increased electrical impedance is generated between the first and second electrode as the liquid in the space between the two electrodes is replaced by gas. In one embodiment, the first electrode is a high-voltage electrode and the second electrode is a ground electrode. In one embodiment, the second electrode is coaxially disposed around the first electrode. In one embodiment, the method includes the step of injecting a gas through a channel disposed between the first and second electrode. In one embodiment, the both the first and second electrodes have a hollow cylindrical geometry, and the second electrode is coaxially disposed around the first electrode. In one embodiment, the method includes the step of injecting a gas through a channel disposed in the first electrode. In one embodiment, an insulation structure is disposed between the first and second electrode along a length of the first electrode. In one embodiment, the vortex is a forward vortex liquid flow. In one embodiment, the vortex is a reverse vortex liquid flow. In one embodiment, the vortex is generated between the first and second electrode. In one embodiment, an increased electrical impedance is generated between the first and second electrode as the liquid in the space between the two electrodes is replaced by gas.

In one embodiment, an electrode assembly includes a high voltage electrode having a proximal end inlet, a distal end outlet and a lumen therebetween, a ground electrode having a proximal and distal end, where the distal end of the ground electrode at least partially surrounds and extends beyond the distal end outlet of the high voltage electrode, and a spacer region between the high voltage electrode and the ground electrode. In one embodiment, the spacer region includes an air gap. In one embodiment, the spacer region includes an insulation structure. In one embodiment, the high voltage electrode is a positive high voltage electrode and the ground electrode is a negative high voltage electrode. In one embodiment, both the high voltage and ground electrode have substantially planar geometries. In one embodiment, the ground electrode is coaxially disposed around the high voltage electrode. In one embodiment, a channel is disposed in the spacer region. In one embodiment, both the high voltage electrode and the ground electrode have a hollow cylindrical geometry. In one embodiment, the high voltage electrode has a hollow cylindrical geometry and the ground electrode has a substantially planar geometry.

In one embodiment, a system for generating a plasma discharge in liquid includes a high voltage electrode having a proximal end inlet, a distal end outlet and a lumen therebetween, a ground electrode, and a vessel for holding a liquid therein, the vessel having at least one liquid inlet and at least one liquid outlet, where the high voltage electrode is positioned within the vessel such that the distal end outlet is submergible in a liquid contained within the vessel. In one embodiment, the at least one liquid inlet and at least one liquid outlet are configured to facilitate the generation of a vortical fluid flow of the liquid. In one embodiment, the at least one liquid inlet and at least one liquid outlet are positioned to generate a reverse vortex liquid flow. In one embodiment, the at least one liquid inlet and at least one liquid outlet are positioned to generate a vortex liquid flow between the high voltage electrode and the ground electrode. In one embodiment, the system includes a spacer region between the high voltage electrode and the ground electrode. In one embodiment, the spacer region includes an air gap. In one embodiment, the spacer region includes an insulation structure. In one embodiment, the high voltage electrode is a positive high voltage electrode and the ground electrode is a negative high voltage electrode. In one embodiment, the ground electrode is coaxially disposed around the high voltage electrode. In one embodiment, a channel is disposed in the spacer region. In one embodiment, both the high voltage electrode and the ground electrode have a hollow cylindrical geometry.

In one embodiment, a method for generating a plasma discharge in liquid is disclosed. The method includes the steps of positioning at least a distal portion of a high voltage electrode in a liquid, the high voltage electrode having a proximal end inlet, a distal end outlet and a lumen therebetween, positioning at least a portion of a ground electrode in the liquid, injecting a gas through the lumen of the high voltage electrode and into the liquid via the distal end outlet, forming a vortex flow pattern between the electrodes within the liquid and generating an electrical voltage between the electrodes to form a plasma within the liquid. In one embodiment, the flow pattern is a forward vortex liquid flow. In one embodiment, the flow pattern is a reverse vortex liquid flow. In one embodiment, the the high voltage electrode is a positive high voltage electrode and the ground electrode is a negative high voltage electrode. In one embodiment, the high voltage electrode is surrounded by an insulator structure. In one embodiment, the high voltage electrode has a hollow cylindrical geometry.

In one embodiment, a system for generating a plasma discharge in liquid includes first and second electrodes spaced apart in an interior space of a vessel, a channel defined at least partially by at least one of the first and second electrodes for injecting a gas in a first direction, and a first inlet in fluid communication with the interior space configured to generate a vortical fluid flow in a second direction in the interior space. In one embodiment, a portion of the channel is directed through a sidewall of the first electrode. In one embodiment, the portion of the channel is substantially tangential to a longitudinal axis of the first electrode. In one embodiment, the first and second direction are the same direction. In one embodiment, the first and second direction are opposite directions.

In one embodiment, a method for generating a plasma discharge in liquid includes the steps of positioning at least a distal portion of a high voltage electrode in a liquid, the high voltage electrode having a proximal end inlet, a distal end outlet and a lumen therebetween, positioning at least a portion of a ground electrode in the liquid, injecting a gas through the lumen of the high voltage electrode and into the liquid at a first direction via the distal end outlet, forming a vortex flow pattern in a second direction between the electrodes within the liquid, and generating an electrical voltage between the electrodes to form a plasma within the liquid. In one embodiment, the gas exits the high voltage electrode through a sidewall of the high voltage electrode. In one embodiment, the gas exits the high voltage electrode tangentially to a longitudinal axis of the high voltage electrode. In one embodiment, the first and second direction are the same direction. In one embodiment, the first and second direction are opposite directions.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION OF THE INVENTION

It is to be understood that the figures and descriptions of the present invention have been simplified to illustrate elements that are relevant for a more clear comprehension of the present invention, while eliminating, for the purpose of clarity, many other elements found in systems and methods of plasma discharge in liquid. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

"HV" as used herein means high-voltage.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

In certain embodiments, vortex flows of liquid can be clockwise or counterclockwise, and they can move from the bottom-up or top-down in a given reactor. Types of vortex flows are also varied and can include spiral flows, tornado flows, forward vortex flows, reverse vortex flows and vortical flows among others. Plasma water treatment reactors likewise may in certain embodiments be oriented vertical, horizontally, or diagonally. In certain embodiments, multiple cathodes, anodes, and electrode sets may be used, and the electrodes may vary in shape, size, material and construction. In certain embodiments, a coaxial electrode set includes an outer ground electrode jacket and inner high-voltage electrode stem, both constructed of stainless steel, and could easily take a different shape and be made of a wide variety of different materials such as tungsten, titanium alloy or electrically conductive ceramic.

Referring now in detail to the drawings, in which like reference numerals indicate like parts or elements throughout the several views, in various embodiments, presented herein is a system and method for plasma discharge in liquid.

Embodiments described herein introduce methods of gas injection at or between two or more electrodes (i.e., at least one ground electrode and one high-voltage electrode) in liquid such that gas bubbles can be contained within the space between two electrodes. The purpose of this method is to provide a non-liquid, gas gap between two electrodes which permits breakdown at high voltage in a reactor filled with liquid. As a result, plasma such as an arc is able to be discharged with the help of gas bubbles in a liquid volume, even high-conductivity liquid. In certain embodiments, an increased electrical impedance is generated between a first and second electrode as the liquid in the space between the two electrodes is replaced by gas. Either gas or gas-liquid mixtures can be injected. Wide varieties of chemicals or chemical combinations can be selected for injection as gas such as oxygen, nitrogen, hydrogen, or inert gases among others, and as liquid as in the case of water to generate hydrogen peroxide or ferrous sulfate solution to induce Fenton's oxidation.

Certain embodiments utilize a co-axial electrode geometry, which consists of two co-axial cylindrical geometries. In certain embodiments, the outer cylindrical tube forms the ground electrode, whereas the inner cylindrical tube forms the high-voltage (HV) electrode. The inner high voltage electrode can have DC high voltage (i.e., positive or negative) or AC high voltage. In certain embodiments of utilizing AC high voltage, the polarity in the high voltage electrode continuously switches between negative and positive. In the co-axial geometry, gas can be introduced through the inner tube space in the HV electrode or alternatively through the space between the two cylindrical electrodes. Since both electrodes are immersed in liquid, an annulus tube made of insulation material (e.g., glass-filled Teflon, Macor, or borosilicate) is used between the outer ground electrode and the HV center electrode tube so that discharge does not take place except at the tip of the HV electrode. For this purpose, the electric insulation material surrounds the HV electrode except at the tip. Such an insulation protection prevents the leakage of electrons from the HV electrode to liquid. This is particularly important in a high-conductivity liquid as the insulation layer prevents electrons from leakage at the HV electrode.

In order to have the HV electrode surrounded by gas inside a plasma reactor filled with liquid, certain embodiments utilize either forward vortex liquid flow or reverse vortex liquid flow inside the plasma reactor. In certain embodiments, in the case of forward vortex liquid flow, a co-axial electrode system is used for the generation of plasma discharge in liquid, whereas in the case of the reverse vortex liquid flow, two electrodes are positioned on the opposite sides (i.e., top and bottom) of the plasma reactor.

Figure 2A:
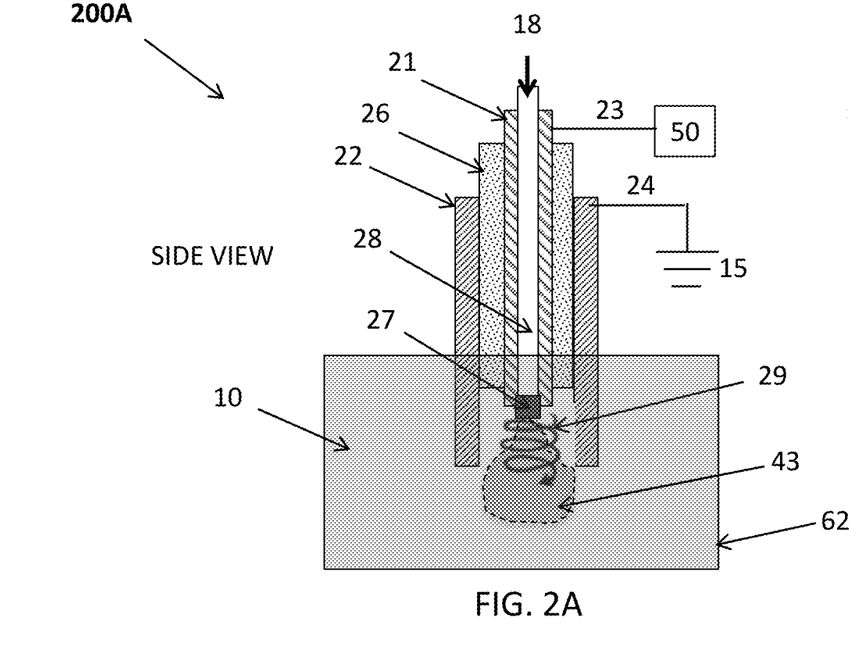
FIG. 2A is a schematic diagram of a vertically positioned co-axial cylindrical electrode in a plasma reactor according to one embodiment, where gas bubbles are introduced from the top.
Figure 2B:
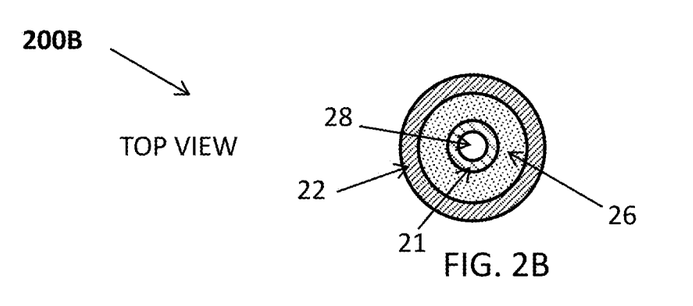
FIG. 2B is a top view and FIG. 2C is a perspective view of the cylindrical electrode.
Figure 2C:
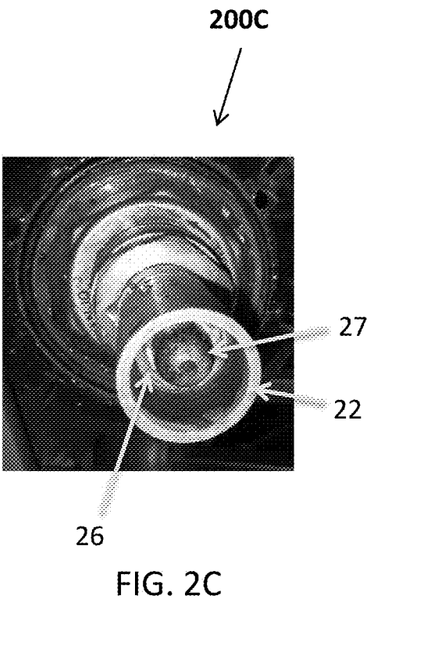

In one embodiment, with reference now to FIGS. 2A-2C, a co-axial cylindrical electrode 200A-C is vertically positioned at the top of vessel 62 for holding a liquid. The outer cylindrical tube 22 forms the ground electrode 22, whereas the inner cylindrical tube 21 forms the HV electrode 21. An annulus tube made of an electrical insulation material 26 such as glass-filled Teflon is used between the outer ground electrode 22 and the HV center electrode tube 21. The HV electrode 21 is connected to HV power supply 50 via a connecting wire 23, whereas the ground electrode 22 is connected to a ground source 15 via a connecting wire 24. Compressed gas 18 is introduced through the channel 28 inside the HV electrode 21. At the end of the HV electrode, a gas spray nozzle 27 is installed to generate a vortex spray flow 29, which rotates, for example, clockwise.

Figure 3A:
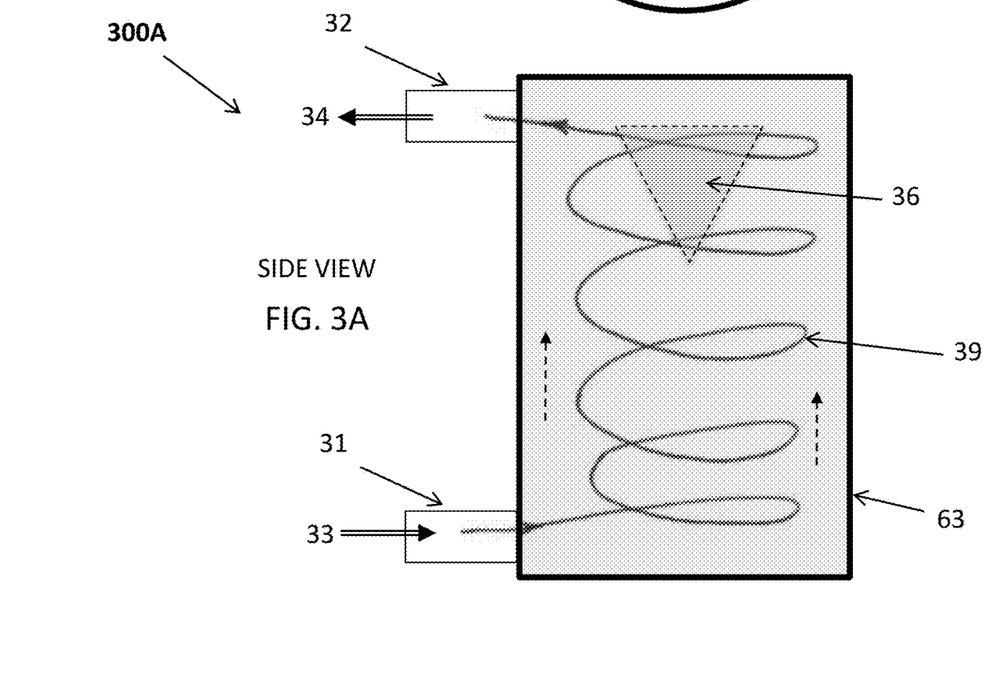
FIGS. 3A and 3B are side view and top view, respectively, showing schematic diagrams of a forward vortex flow of liquid to be treated in plasma reactor according to one embodiment. The liquid to be treated enters the plasma reactor from one end of the reactor tangentially through an inlet, making clockwise spiral vortex flow and leaving the reactor also tangentially through an exit at the other end of the reactor.
Figure 3B:
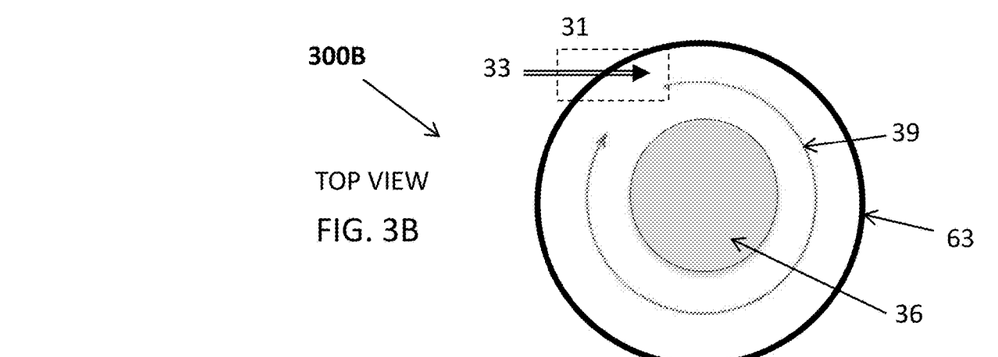

Referring now to FIGS. 3A and 3B, in one embodiment, incoming liquid 33 enters the plasma reactor 63 from the bottom of the reactor 63 tangentially through an inlet 31, forming clockwise forward vortex flows 39. Exiting liquid 34 leaves the reactor 63 also tangentially through an exit 32 at the top of the reactor 63. Forward vortex flow 39 of liquid creates a low-pressure zone at the center of the reactor 63 as the centrifugal force pushes liquid molecules outward along the radial direction. Accordingly, as shown in the side and top views of the system 300A, B, the compressed air 18 introduced through the channel 28 inside the HV electrode tube 21 occupies the low-pressure zone 36 of an inverted cone shape in the reactor 63, naturally forming a gas pocket at the center of the reactor 63.

Figure 4:
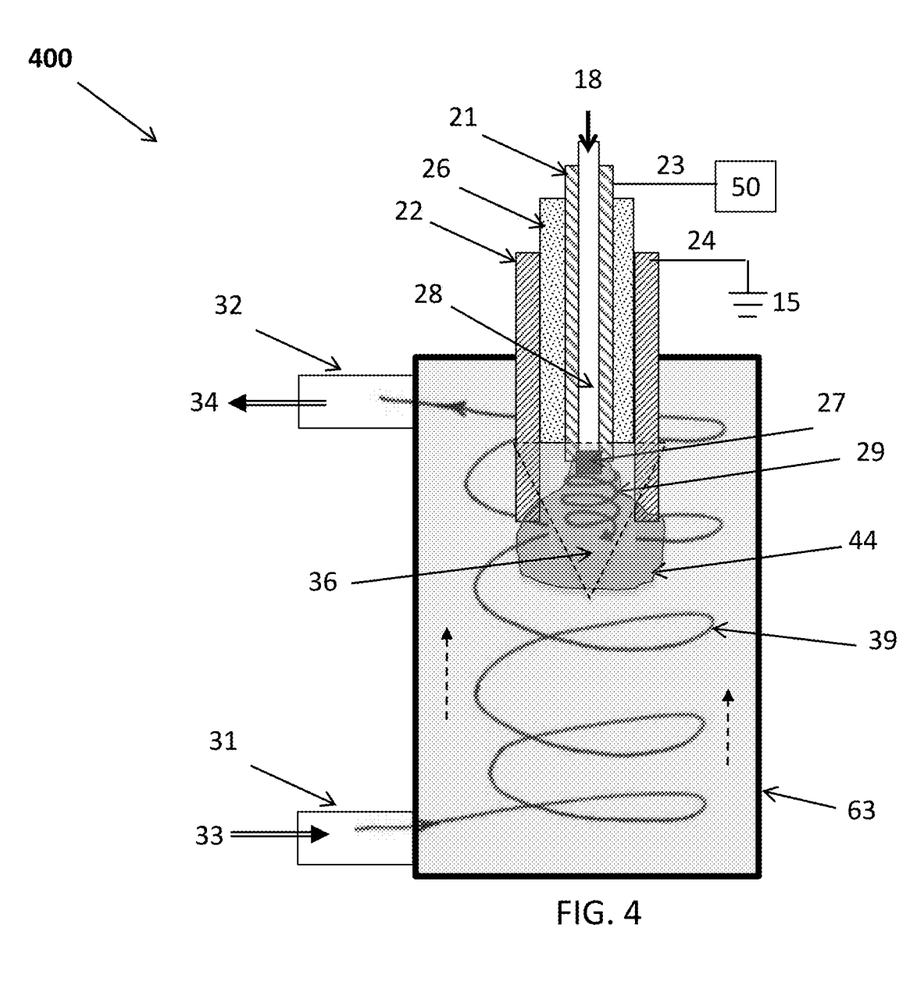
FIG. 4 is a schematic of forward vortex flows of compressed gas and liquid, both rotating in the same (i.e., clockwise) direction according to one embodiment. Due to the centrifugal force created by the spiral vortex flow of liquid, a low-pressure zone is created at the middle of the plasma reactor, which subsequently fills with compressed gas. The middle zone filled with gas inside the reactor provides an ideal medium for the stable generation of plasma arc discharge in plasma reactor.

Referring now to FIG. 4, in one embodiment of a system 400, as the centrifugal force produced by the forward vortex flow of liquid 39 creates a low-pressure zone 36 at the middle of the plasma reactor 63, compressed gas 18 fills the low-pressure zone 36. In one embodiment, the HV electrode 21 and the ground electrode 22 are positioned at the same side (e.g., top) in the middle of the low-pressure zone 36, which is filled with gas surrounded by liquid 10. Thus, the low-pressure zone 36 provides an ideal medium for the generation of plasma arc discharge in the reactor 63 as the HV electrode 21 is surrounded by gas. If the HV electrode 21 makes contact with liquid for even a brief period of time (e.g., >0.5 s), then the short circuit occurs and plasma will extinguish. Thus, it is preferred to have the HV electrode surrounded by gas at all times. In this embodiment, the direction of vortex flow of gas 29 is the same as the direction of the forward vortex flow of liquid 39, i.e., both clockwise directions. In certain embodiments, when the direction of vortex flow of gas 29 is the same as the direction of the forward vortex flow of liquid 39, the counterclockwise direction can also be used.

As plasma arc discharge 44 is produced at the low-pressure zone 36, the compressed gas 18 coming through the channel 28 in the HV electrode 21 pushes the plasma discharge downward, creating arc jet in the middle of rotating liquid 39 along the inner wall of the reactor 63. In other words, the low-pressure zone expands the arc discharge so that the interface surface of the arc 44 is significantly increased, increasing the treatment efficiency of the liquid 10 as the direct contact surface between the arc discharge 44 and liquid increases. In addition, as plasma arc discharge 44 is produced at the low-pressure zone 36, the compressed gas 18 coming through the channel 28 in the HV electrode 21 pushes the plasma discharge downward, creating arc jet in the middle of rotating liquid 39 along the inner wall of the reactor 63. In other words, the low-pressure zone expands the arc discharge so that the interface surface of the arc 44 is significantly increased, increasing the treatment efficiency of the liquid 10 as the direct contact surface between the arc discharge 44 and liquid increases.

Figure 5:
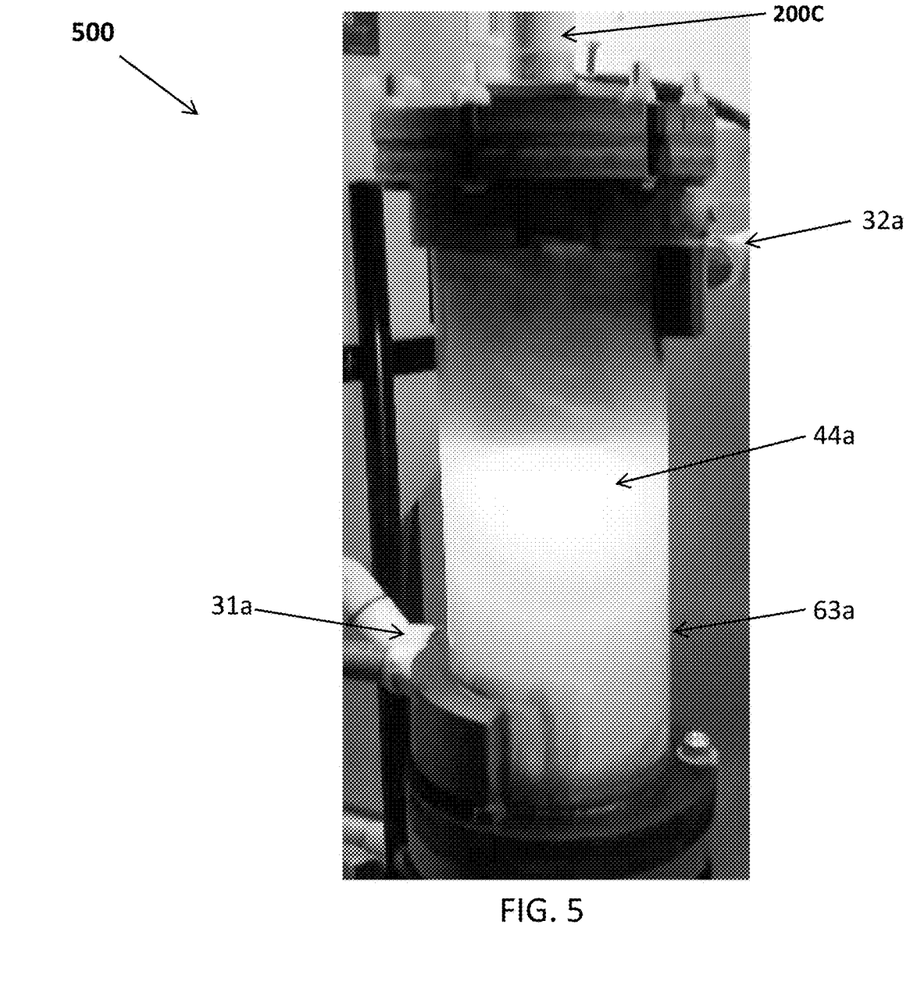
FIG. 5 is a photograph of a plasma arc discharge in produced water in a plasma reactor. The flow rate of produced water was 20 gallons per minute.

With reference now to FIG. 5, a photograph shows an embodiment of a system including the plasma reactor 63a with liquid inlet 31a and outlet 32a, and co-axial electrode 200c installed at the top of the reactor 63a. Also shown is the plasma arc discharge 44a obtained in a test conducted using produced water in the plasma reactor 63a in the present invention. The flow rate of produced water was 20 gallons per minute, which generated a strong spiral vortex flow of produced water. The photograph depicts that the arc discharge 44a had strong UV radiation. In addition, the intensely bright color of the arc discharge supports the notion that the temperature of the arc surface in the produced water could be over 2,000K (see for example A. Czernichowski et al. and O. Mutaf-Yardimci et al.).

Figure 6A:
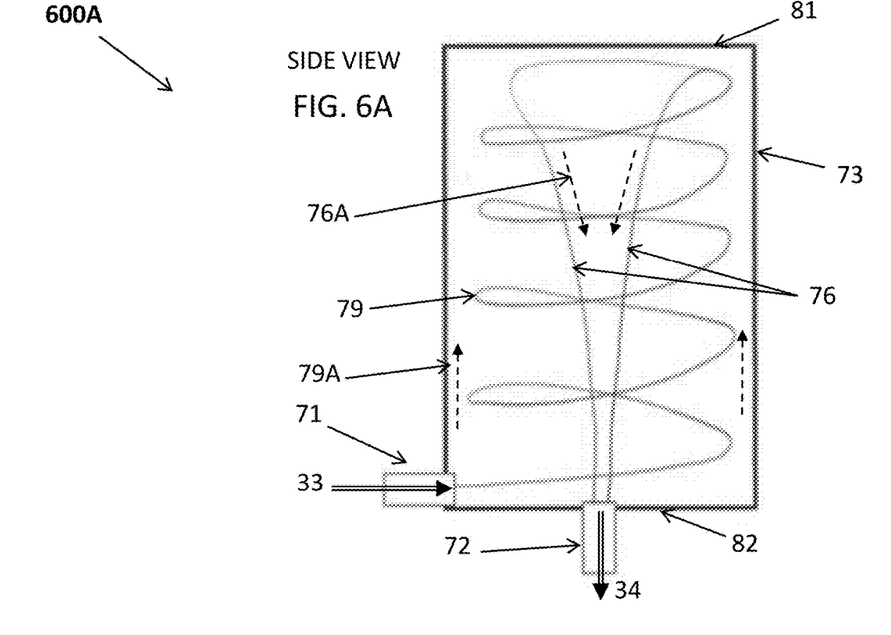
FIGS. 6A and 6B are side and top views, respectively, showing schematic diagrams of a reverse vortex flow of liquid to be treated in plasma reactor. The liquid to be treated enters the plasma reactor from one end of the reactor tangentially through an inlet, making counterclockwise spiral vortex flow and leaving the reactor longitudinally through an exit at the center of the same end of the reactor from which it entered.
Figure 6B:
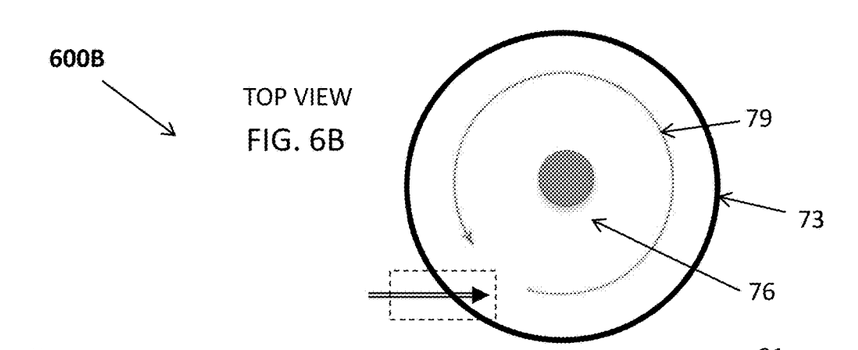

In one embodiment of a system 600A, B, with reference now to FIGS. 6A and 6B, incoming liquid 33 enters the plasma reactor 73 tangentially through an inlet 71 located at one end (e.g., near the bottom) of the reactor 73, forming counterclockwise reverse vortex flows 79. The reverse vortex flow 79 moves along the outer edge of the reactor, moving upward as indicated by two dashed arrows 79A in FIG. 6. Reverse vortex flow 79 of liquid creates a low-pressure zone 76 at the center of the reactor 73 as the centrifugal force pushes liquid molecules outward along the radial direction. Accordingly, the compressed air 18 introduced from top through the channel 78 inside the HV electrode tube 74 (see for example FIG. 7), occupies or fills the low-pressure zone 76 in the reactor 73, naturally forming a gas pocket 76 at the center of the reactor 73. Since there is only one exit 72 for both liquid and gas, liquid 34 as well as gas leave through an exit 72 located at the center longitudinally at the same end 82 of the reactor 73 from which liquid entered (e.g., in the bottom). From a two-dimensional perspective, in the reactor 73 with reverse vortex liquid flow 79, liquid moves up along the side wall of the reactor first (i.e., see two upward dashed arrows 79A), and then moves down vertically along the center of the reactor (i.e., see two downward dashed arrows 76A inside the air pocket 76) and leaves the reactor 73 through an exit 72 at the bottom 82 of the reactor 73. The gas enters from the channel 78 inside the HV electrode 74 (see for example FIG. 7) located at the opposite (e.g., top) of the reactor 73 and moves down vertically with liquid and leaves the reactor 73 through the exit 72 longitudinally at the same end 82 as liquid originally entered (e.g., bottom) the reactor 73, as it is the only outlet for both liquid and gas in the case of the reactor 73 with the reverse vortex flow 79.

Figure 7:
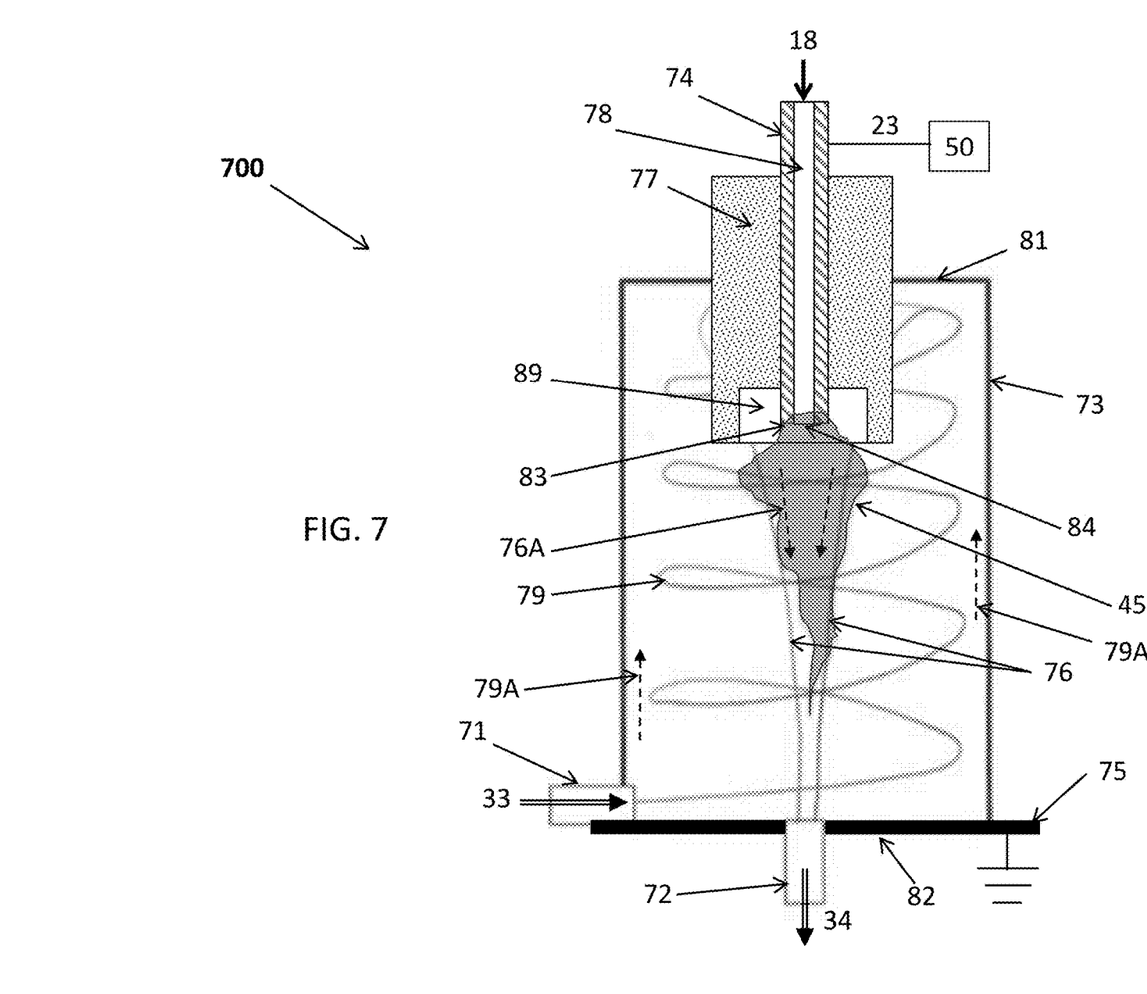
FIG. 7 is a schematic of reverse vortex flows of compressed gas and liquid, both rotating in the same (i.e., counterclockwise) direction according to one embodiment. Due to the centrifugal force created by the reverse vortex flow of liquid, a low-pressure zone is created at the center of the plasma reactor, where the gas is pulled down due to the reverse vortex flow, pulling the plasma discharge downward toward the ground electrode.

In one reverse vortex flow system 700, according to an embodiment, as the centrifugal force produced by the reverse vortex flow 79 creates a low-pressure zone 76 at the middle of the plasma reactor 73, compressed gas 18 fills the low-pressure zone 76. The unique feature of the reactor 73 with the reverse vortex flow 79 is that the low-pressure zone 76 extends all the way to the bottom 82 of the reactor 73. On the contrary, in the reactor 63 with forward vortex flow 39, the low-pressure zone 36 is limited to the upper area near the HV electrode 21 in the reactor 63 as both liquid and gas must leave the reactor 63 through an exit 32 located near the top of the reactor 63. Furthermore, as the density of gas is about 1,000 times smaller than liquid, the gas in the low-pressure zone 36 tends to rise, further limiting the low-pressure zone 36 in the forward vortex flow 39.

The reverse vortex reactor 73 has the HV electrode 74 and the ground electrode 75 positioned at the opposite sides, e.g., top 81 and bottom 82 in the reactor 73, respectively. For example, the HV electrode 74 is positioned at the top 81 of the reactor 73, whereas the ground electrode 75 is positioned at the bottom 82 of the reactor 73. The reverse vortex liquid flow 79 creates an extended air channel 76 between the two electrodes 74 and 75 as shown schematically in FIG. 7. Thus, the extended air channel 76 of the low-pressure zone is naturally filled with compressed gas 18 injected through the channel 78 inside the HV electrode 74, providing an ideal path and condition for high-voltage plasma discharge 45 inside the reactor 73 filled by liquid. The gas channel 76 surrounds the HV electrode 74, generating plasma arc discharge 45 in the reactor 73, and thus UV radiation as well as all the reactive species generated from the plasma discharge remain inside the reactor 73. The reactive species include OH, O, $O_3$, $H_2O_2$, $NO_x$, and electric fields. Since most reactive species have short half-life (on the order of milliseconds) except for ozone and hydrogen peroxide, it is beneficial to generate these reactive species near the liquid or inside liquid in the reactor 73 such that the reactive species make direct contact with liquid molecules as the reactive species are generated.

One of the major benefits of the reverse vortex flow 79 in the reactor 73 is that the gas moves downward as the exit for both liquid and gas is located at the bottom of the reactor 73. Consequently, the plasma discharge 45 is extended or stretched downward, increasing the size of the plasma discharge much larger than the plasma discharge 44 in the forward vortex flow 39 in the reactor 63. Furthermore, the gas channel 76 surrounds the HV electrode 74, thus preventing liquid from making contact with the HV electrode 74. In certain embodiments, if the HV electrode 74 makes contact with liquid for more than 0.5 s, then the short circuit occurs between the two electrodes 74 and 75, and plasma will extinguish. Thus, it is preferable to have the HV electrode 74 surrounded by gas at all times. The direction of reverse vortex flow of liquid 79 can be in either clockwise or counterclockwise direction. The embodiments of FIGS. 6 and 7 show the reverse vortex flow 79 in the counterclockwise direction. FIG. 7 shows that the compressed gas 18 enters the gas channel 78 and leaves through an exit 84 at the end 83 of the HV electrode tube 74. In this case, the compressed gas 18 naturally moves down (indicated by two dashed arrows 76A inside air pocket 76) following the exiting liquid in the middle of the reactor 73. In one embodiment, both the high voltage and ground electrode have substantially planar geometries. In one embodiment, the high voltage electrode has a hollow cylindrical geometry and the ground electrode has a substantially planar geometry.

Figure 8A:
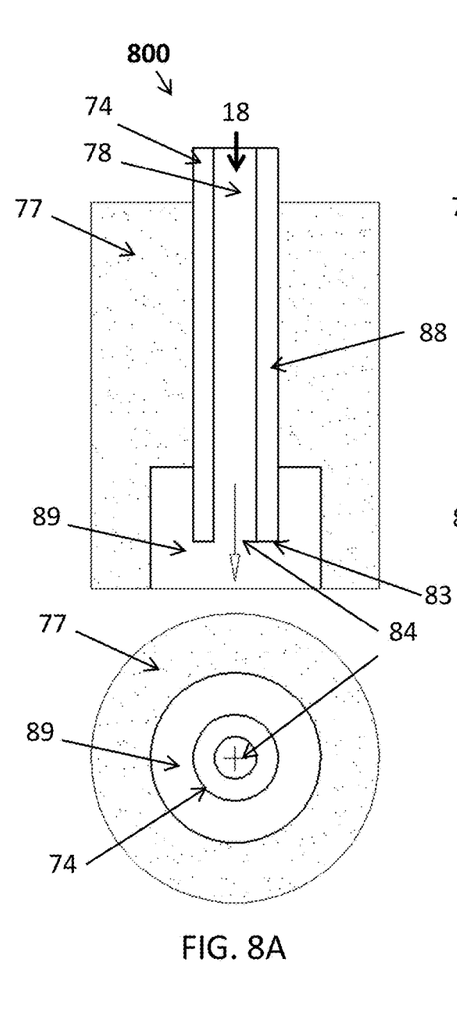
FIGS. 8A-8C are schematics illustrating embodiments of using compressed gas through a channel inside the HV electrode in the plasma reactor together with reverse vortex flows.
Figure 8B:
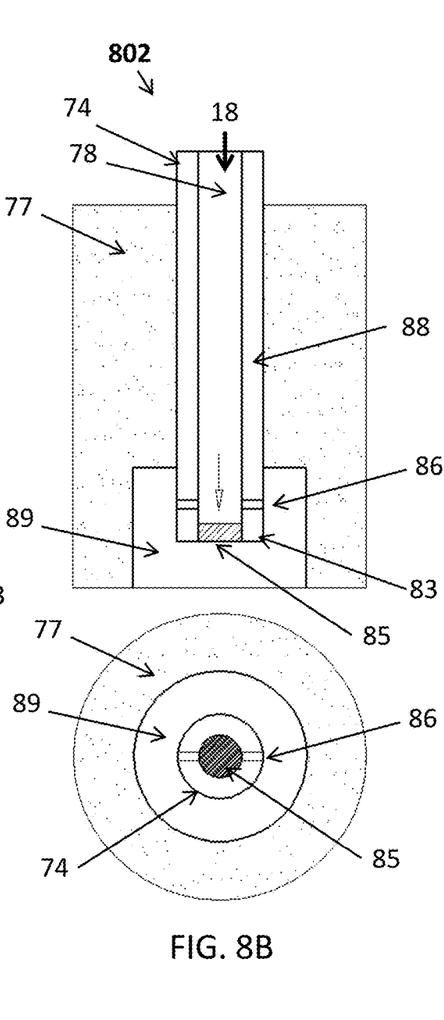
Figure 8C:
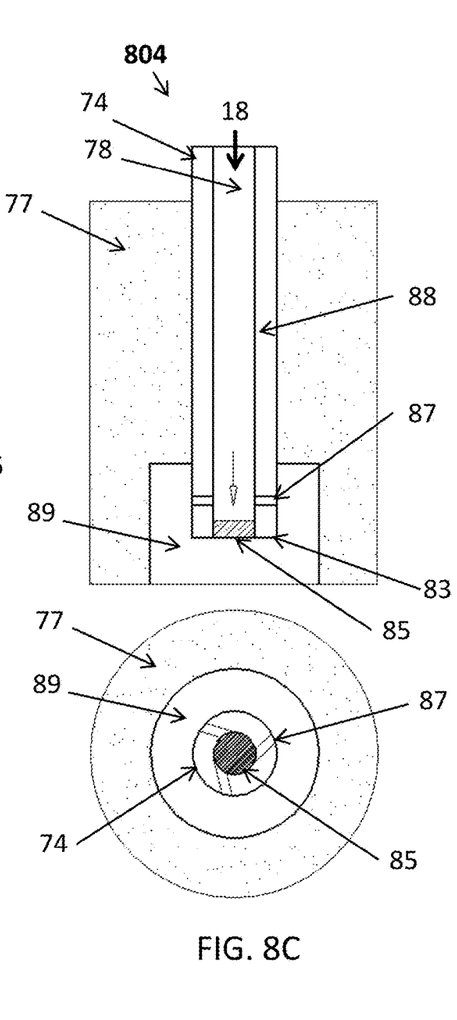

Referring now to FIGS. 8A-8C, three different embodiments of using a path of compressed gas 18 through the channel inside the HV electrode 74 are shown. FIG. 8A shows one embodiment of a system 800 similar to that described in FIG. 7, where the compressed gas 18 enters the gas channel 78 and leaves through an exit 84 at the end 83 of the HV electrode tube 74. An insulator block 77 is used to electrically insulate the HV electrode 74 from making contact with liquid, which is electrically conductive. The low end of the insulator block 77 and the HV electrode form a pocket or gap space 89. This pocket or gap space will be filled with compressed gas during operation, as the density of gas is about 1,000 times smaller than that of liquid, providing an ideal place and condition for the generation of plasma discharge.

In another embodiment of a system 802 shown in FIG. 8B, the compressed gas 18 exits the HV electrode 74 through hole(s) 86 made normal to the sidewall 88 of the HV electrode tube 74. In this case, the bottom end 83 of the HV electrode tube 74 is blocked with an end plug 85. Instead, a hole or multiple (two, four, or eight) holes 86 are made on the sidewall 88 so that compressed gas 18 can leave the channel 78 inside the HV tube 74 through the hole(s) 86 made near the bottom end of the sidewall 88. One advantage of this arrangement is that compressed gas first fills the gap space 89 between the HV electrode 74 and insulator 77, so that the HV electrode 74 is always surrounded by gas medium 18, making the plasma discharge 45 much more stable over time. For example, sporadic extinction and re-ignition of plasma discharge 44 occurring in the reactor 63 using the forward vortex 39 does not take place in the reactor 73 using the reverse vortex flow 79, as compressed gas 18 in the gap space 89 is always filled with gas, thus preventing liquid from making contact with the HV electrode 74 in the reactor 73 with the reverse vortex flow 79 during operation.

In another embodiment of a system 804 shown in FIG. 8C, the compressed gas 18 exits the HV electrode 74 through multiple tangential hole(s) 87 made on the near the bottom end 83 of the sidewall 88 of the HV electrode tube 74. In this case, the bottom end 83 of the HV electrode tube 74 is blocked with an end plug 85. Note that the compressed gas 18 can leave the HV electrode 74 tangentially, creating a vortex spiral flow inside the gap space 89 between the HV electrode and insulator 77. An advantage of this arrangement is that compressed gas first fills the gap space 89 between the HV electrode 74 and insulator 77, so that the HV electrode 74 is always surrounded by gas medium 18. In addition, compressed gas rotates in the same direction as the liquid, making the plasma discharge much more stable over time. Alternatively, the geometry of the tangential holes 87 could be configured so that compressed gas rotates in the opposite direction as the liquid, increasing turbulence and mixing of the plasma-induced reactive species with liquid in the reactor.

Figure 9:
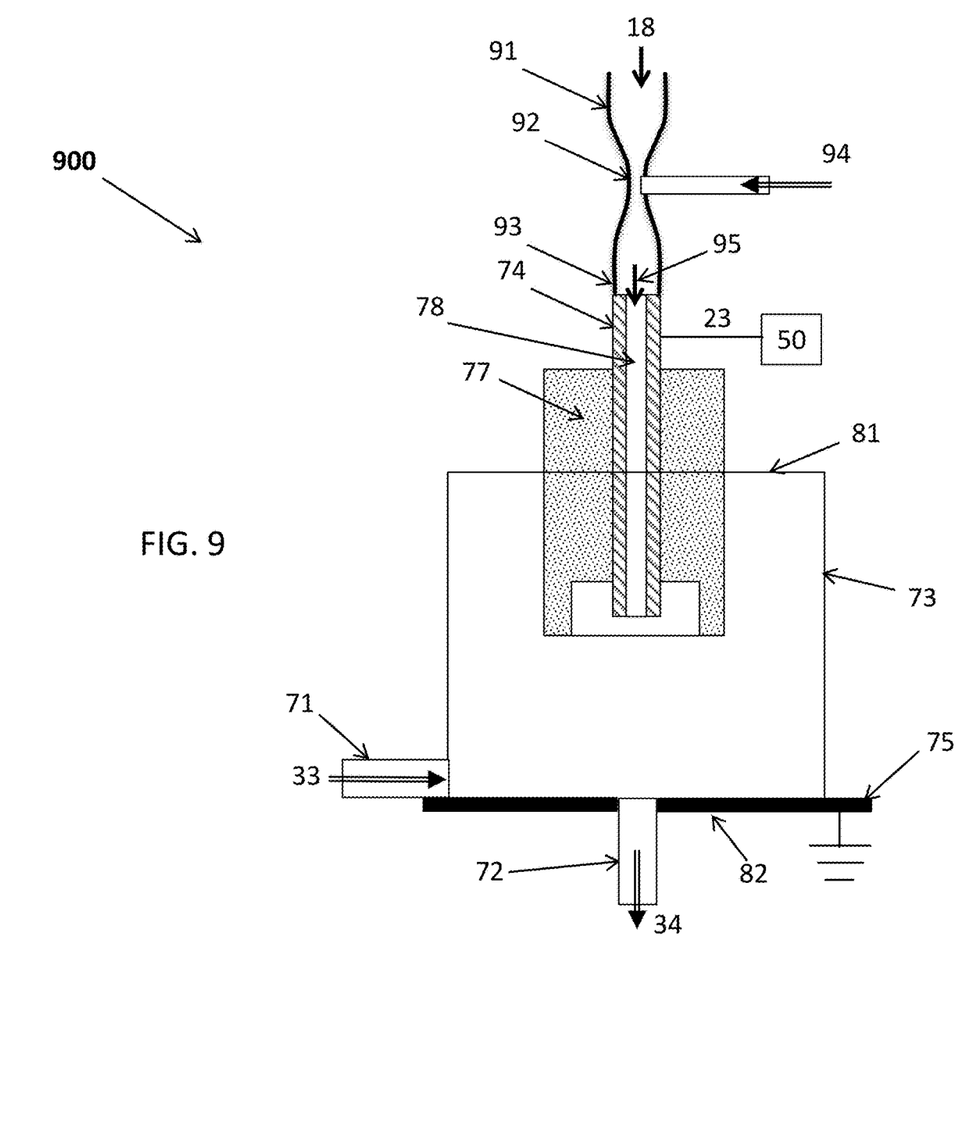
FIG. 9 is a schematic illustrating an embodiment of the system that injects water to the stream of compressed gas supplied to plasma reactor.

With reference now to FIG. 9, a system 900 utilizing a water injection method is shown according to one embodiment, where a device, such as a venturi tube, aspirator or atomizer, is utilized to inject liquid 94 into the stream of compressed gas 18. Depending on the specific water treatment application, it may be desirable to introduce sprays (i.e., small droplets of less than 100 microns in size) comprised of distilled water, tap water, or sea water into the plasma reactor to generate hydrogen peroxide ($H_2O_2$), which is an effective powerful biocide and oxidizer among the reactive species produced by plasma discharge. In addition, any other solution may be injected at this location in order to create a specifically desired chemical treatment process, such as ferrous sulfate solution to induce Fenton's oxidation. Compressed gas 18 flows through the device 91 (e.g., a venturi), and negative vacuum pressure is created at the throat 92 of the venturi according to Bernoulli's Law. A liquid line is connected to the venturi throat 92, where the vacuum sucks liquid 94 into the stream of gas 18, thus mixing 95 the liquid and fast-moving gas together. Accordingly, small droplets of liquid particles are generated and collide with the plasma discharge 45, thus producing hydrogen peroxide ($H_2O_2$) in the case of water injection. Alternatively, a separate pump can be utilized to inject liquid to fast moving air streams without the use of venturi, or an aspirator or atomizer device may be used.

Figure 10:
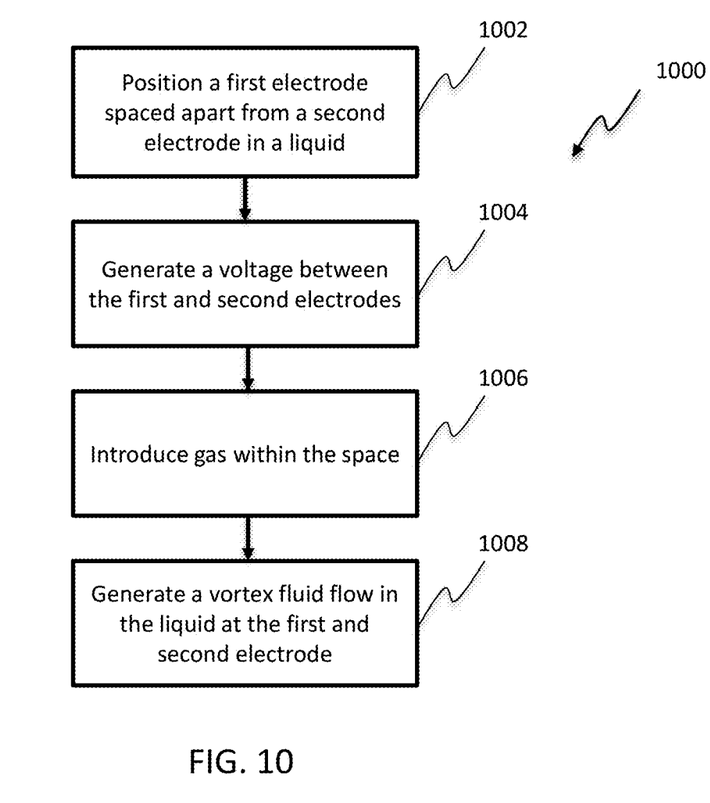
FIG. 10 is a flow chart of a method according to one embodiment.

A method 1000 according to one embodiment is shown in the flow chart of FIG. 10. In one embodiment, a first electrode and a second electrode are positioned in an interior space of the liquid 1002. The first electrode is positioned separated from the second electrode and an electrical voltage is applied between the first and second electrode 1004. The physical geometry and location of the first and second electrode can for example follow the embodiments disclosed herein. Gas is injected through a channel 1006 defined at least partially by at least one of the first and second electrodes, and a vortex flow is generated 1008 in the liquid at a tip of the first electrode. Generation of vortical flow can for example be according to the various embodiments described herein. In one embodiment, the first electrode is a high-voltage electrode and the second electrode is a ground electrode. In one embodiment, the second electrode is coaxially disposed around the first electrode. The method can also include the step of injecting a gas through a channel disposed between the first and second electrode. In one embodiment, both the first and second electrodes have a hollow cylindrical geometry, and the second electrode is coaxially disposed around the first electrode. The method can also include the step of injecting a gas through a channel disposed in the first electrode. In one embodiment, an insulation structure is disposed between the first and second electrode along a length of the first electrode. In one embodiment, the vortex is a forward vortex liquid flow. In one embodiment, the vortex is a reverse vortex liquid flow. In one embodiment, the vortex is generated between the first and second electrode. In one embodiment, an increased electrical impedance is generated between the first and second electrode as the liquid in the space between the two electrodes is replaced by gas.

Advantages of the embodiments disclosed herein provide numerous benefits. One major benefit of the present invention is that it provides a method to generate plasma arc discharge in a cylindrical reactor, where a large volume of water passes through at a flow rate of approximately 10-100 gpm. Both forward and reverse vortex flows of liquid in the present invention create a low-pressure zone at the center of the reactor, which is extremely useful in the generation of plasma arc discharge in liquid. The low-pressure zone created by the forward and reverse vortex flows of liquid helps the arc discharge to expand as compressed gas pushes the arc from the small space between the two electrodes into the middle of the reactor. Accordingly, the interface surface of the arc increases, thus the contact between the arc and water increases, making the plasma treatment to become more efficient. Further, both forward and reverse vortex flows in the reactor increase the residence time of water in the reactor. Accordingly, the contact time between plasma arc and water, thus the treatment time of water increases. In addition, both forward and reverse vortex flows become stronger with increasing liquid flow rate. Thus, the low-pressure zone at the center of the plasma reactor increases with increasing liquid flow rate. Hence, the present method of creating arc discharge is an ideal method for the plasma treatment with a large liquid flow rate. In other words, the present method of forward and reverse vortex flows can be scaled up to very large flow applications.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

What is claimed is:

1. A system for generating a plasma discharge in liquid comprising:
   first and second electrodes spaced apart, the first electrode being a high voltage electrode, and the second electrode being a ground electrode;
   a channel defined at least partially by the first electrode for injecting a gas in a first direction, at least a portion of the channel being directed through a sidewall of the first electrode, the channel terminated at a bottom end in a structure configured to block gas flow and redirect gas through the sidewall; and
   an inlet in fluid communication with an interior space of a vessel configured to generate a vortical fluid flow in a second direction in the interior space.

2. The system of claim 1, wherein the portion of the channel is substantially tangential to a longitudinal axis of the first electrode.

3. The system of claim 1, wherein at least a portion of the channel is directed through a plurality of openings in the sidewall of the first electrode.

4. The system of claim 1, wherein the first and second direction are the same direction.

5. The system of claim 1, wherein the first and second direction are opposite directions.

6. The system of claim 1, wherein the first and second direction are different directions.

7. The system of claim 1, wherein the second electrode is disposed at a bottom portion of the vessel.

8. A method for generating a plasma discharge in liquid comprising:
   providing the system of claim 1;
   positioning the first and second electrodes in a liquid;
   injecting a gas through the channel;
   forming a vortex flow pattern that moves initially in an upward direction within the liquid; and
   generating an electrical voltage between the electrodes to form a plasma within the liquid.

9. The method of claim 8 further comprising:
   continuously surrounding the first electrode with a gas during the step of generating an electrical voltage.

10. A system for generating a plasma discharge in liquid comprising:
    first and second electrodes spaced apart, the first electrode being a high voltage electrode, and the second electrode being a ground electrode positioned at a bottom portion of a vessel;
    a channel defined at least partially by the first electrode for injecting a gas in a first direction;
    an inlet in fluid communication with an interior space of the vessel configured to generate a vortical fluid flow in a second direction in the interior space; and
    an outlet that extends through the second electrode in fluid communication with the interior space.

11. The system of claim 10, wherein the second electrode is substantially planar.

12. The system of claim 10, wherein the inlet and the outlet are positioned to generate a forward vortex liquid flow.

13. The system of claim 10, wherein the inlet and the outlet are positioned to generate a reverse vortex liquid flow.

14. The system of claim 10, wherein the outlet is connected to a bottom portion of the vessel.

* * * * *